United States Patent
Chen et al.

(10) Patent No.: US 8,765,569 B2
(45) Date of Patent: Jul. 1, 2014

(54) MOLYBDENUM OXIDE TOP ELECTRODE FOR DRAM CAPACITORS

(75) Inventors: Hanhong Chen, San Jose, CA (US); Wim Deweerd, San Jose, CA (US); Hiroyuki Ode, Hiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 425 days.

(21) Appl. No.: 13/160,132

(22) Filed: Jun. 14, 2011

(65) Prior Publication Data

US 2012/0322221 A1  Dec. 20, 2012

(51) Int. Cl.
  *H01L 21/20* (2006.01)
  *H01L 21/8242* (2006.01)
  *H01L 21/329* (2006.01)

(52) U.S. Cl.
  USPC .... 438/399; 438/239; 438/253; 257/E21.008; 257/E21.351; 257/E21.648

(58) Field of Classification Search
  USPC ......... 438/171, 190, 210, 238, 239, 244, 253, 438/329, 381, 387, 396–399, 608; 257/E21.008, E21.09, E21.158, 257/E21.35, E21.351, E21.364, E21.647, 257/E21.648
  See application file for complete search history.

(56) References Cited

U.S. PATENT DOCUMENTS

| 5,677,572 A | 10/1997 | Hung et al. |
| 5,872,698 A * | 2/1999 | Bai et al. ........................ 361/503 |
| 6,242,321 B1 | 6/2001 | Acosta et al. |
| 6,509,601 B1 * | 1/2003 | Lee et al. ........................ 257/310 |
| 2002/0074584 A1 * | 6/2002 | Yang ............................. 257/300 |
| 2007/0090461 A1 | 4/2007 | Eliason et al. |
| 2008/0157664 A1 | 7/2008 | Cok |

OTHER PUBLICATIONS

Kim, S., et al.; Al-Doped TiO2 Films with Ultralow Leakage Currents for Next Generation DRAM Capacitors; 2008; Seoul National University Industry Foundation; Advanced Materials, pp. 1429-1435.

* cited by examiner

*Primary Examiner* — Calvin Choi

(57) ABSTRACT

A metal oxide bilayer second electrode for a MIM DRAM capacitor is formed wherein the layer of the electrode that is in contact with the dielectric layer (i.e. bottom layer) has a desired composition and crystal structure. An example is crystalline $MoO_2$ if the dielectric layer is $TiO_2$ in the rutile phase. The other component of the bilayer (i.e. top layer) is a sub-oxide of the same material as the bottom layer. The top layer serves to protect the bottom layer from oxidation during subsequent PMA or other DRAM fabrication steps by reacting with any oxygen species before they can reach the bottom layer of the bilayer second electrode.

19 Claims, 6 Drawing Sheets

MOLYBDENUM OXIDE TOP ELECTRODE FOR DRAM CAPACITORS

This document relates to the subject matter of a joint research agreement between Intermolecular, Inc. and Elpida Memory, Inc.

FIELD OF THE INVENTION

The present invention relates generally to the use of non-noble metal electrodes in capacitors used in Dynamic Random Access Memory (DRAM) devices.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

One class of high-k dielectric materials possessing the characteristics required for implementation in advanced DRAM capacitors are high-k metal oxide materials. Titanium dioxide ($TiO_2$) is a metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of $TiO_2$, the anatase crystalline phase of $TiO_2$ has a dielectric constant of approximately 40, while the rutile crystalline phase of $TiO_2$ can have a dielectric constant of approximately >80. Due to the higher-k value of the rutile-phase, it is desirable to produce $TiO_2$ based DRAM capacitors with the $TiO_2$ in the rutile-phase. The relative amounts of the anatase phase and the rutile phase can be determined from x-ray diffraction (XRD). From Eqn. 1 above, a $TiO_2$ layer in the rutile-phase could be physically thicker and maintain the desired capacitance. The increased physical thickness is important for lowering the leakage current of the capacitor. The anatase phase will transition to the rutile phase at high temperatures (>800 C.). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$. For example, $MoO_3$ (the most oxygen-rich phase) has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in a reducing atmosphere have been developed that allow crystalline $MoO_2$ to be used as the first electrode (i.e. bottom electrode) in MIM DRAM capacitors with $TiO_2$ or doped-$TiO_2$ high-k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. However, these MIM DRAM capacitors have continued to use noble metal (i.e. Ru) materials for the second electrode (i.e. top electrode).

The use of crystalline $MoO_2$ as a second electrode in MIM DRAM capacitors has been difficult due to a number of problems. After the formation of the second electrode, the capacitor stack is then subjected to a post metallization anneal (PMA) treatment. The PMA treatment serves to crystallize the second electrode and to anneal defects and interface states that are formed at the dielectric/second electrode interface during the deposition. Also, if there is no post dielectric anneal (PDA) treatment done before metallization, PMA treatment can served to crystallize the dielectric layer. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and having internal docket number (IM0223_US) and is incorporated herein by reference. As discussed above, $MoO_2$ is sensitive to oxidation to oxygen-rich compounds that negatively impact its performance as an electrode material. The reducing atmosphere anneal processes discussed previously with respect to the use of crystalline $MoO_2$ as a first electrode are not an option at this stage of the device manufacture because they would degrade the performance of the dielectric layer through the formation of oxygen vacancies.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C.) processes may be applied to complete the device fabrication. During these subsequent process steps, the DRAM electrode materials must remain chemically, physically, and structurally stable. They must maintain the structural, compositional, physical, and electrical properties that have been developed. Furthermore, they should not undergo significant interaction or reaction with the dielectric layer which may degrade the performance of the DRAM capacitor.

Therefore, there is a need to develop methods for the formation of non-noble metal materials for use as a second electrode in MIM DRAM capacitors that are compatible with PMA treatments and the remaining steps used to fabricate the DRAM device. Specifically, there is a need to develop methods for the formation of metal oxide materials for use as a second electrode in MIM DRAM capacitors that are compatible with PMA treatments and the remaining steps used to fabricate the DRAM device.

SUMMARY OF THE INVENTION

In some embodiments of the present invention, a metal oxide bilayer second electrode for a MIM DRAM capacitor is formed wherein the layer of the electrode that is in contact with the dielectric layer (i.e. bottom layer of the electrode) has a desired composition and crystal structure. One example is crystalline $MoO_2$ if the dielectric layer is $TiO_2$ in the rutile phase. In some embodiments of the present invention, the other component of the bilayer (i.e. top layer) is a sub-oxide of the same material as the bottom layer (i.e. $MoO_{2-x}$ where x is between 0 and 2). In other embodiments of the present invention, the other component of the bilayer (i.e. top layer) is a sub-oxide of a different conductive metal oxide. The top layer serves to protect the bottom layer from oxidation during subsequent PMA or other DRAM fabrication steps by reacting with any oxygen species before they can reach the bottom layer of the bilayer second electrode.

In a second example, the bottom layer of the second electrode bilayer comprises $RuO_2$ and the top layer of the second electrode bilayer comprises Ru metal.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
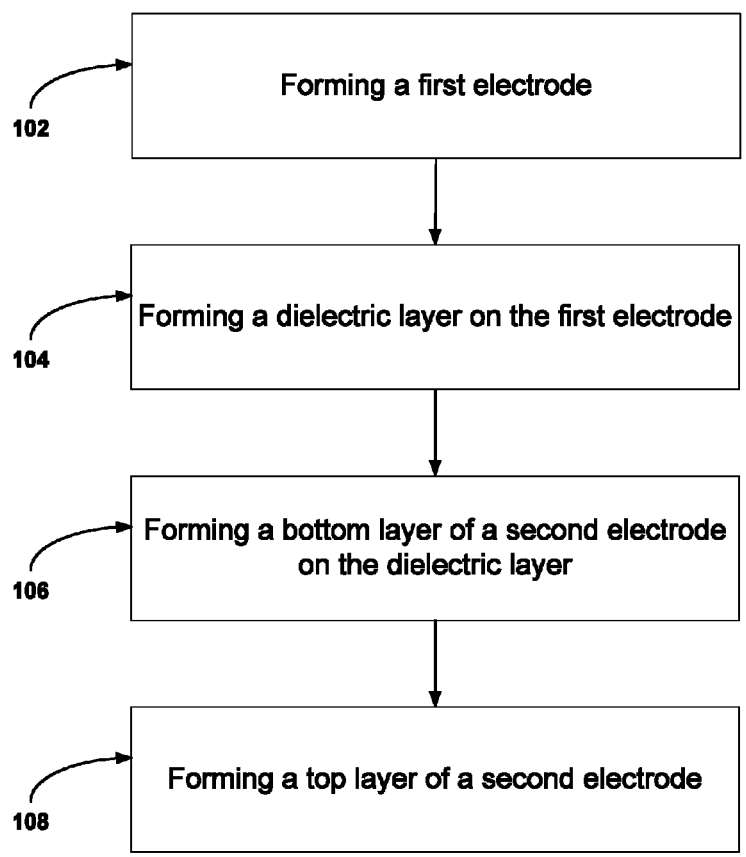
FIG. 1 illustrates a flow chart illustrating a method for fabricating a DRAM capacitor stack in accordance with some embodiments of the present invention.

FIG. 1 describes a method, 100, for fabricating a DRAM capacitor stack. The initial step, 102, comprises forming a first electrode layer on a substrate. Examples of suitable electrode materials comprise metals, conductive metal oxides, conductive metal silicides, conductive metal nitrides, and combinations thereof. A particularly interesting class of materials is the conductive metal oxides. Optionally, the first electrode layer can be subjected to an annealing process (not shown). The next step, 104, comprises forming a dielectric material on the first electrode layer. Optionally, the dielectric layer can be subjected to an annealing process (not shown). The next step, 106, comprises forming a bottom layer of a bilayer second electrode on the dielectric layer. The next step, 108, comprises forming a top layer of a bilayer second electrode on the bottom layer of a bilayer second electrode.

Those skilled in the art will appreciate that each of the first electrode layer, the dielectric layer, and the bilayer second electrode structure (both bottom and top portions) used in the MIM DRAM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

Figure 2:
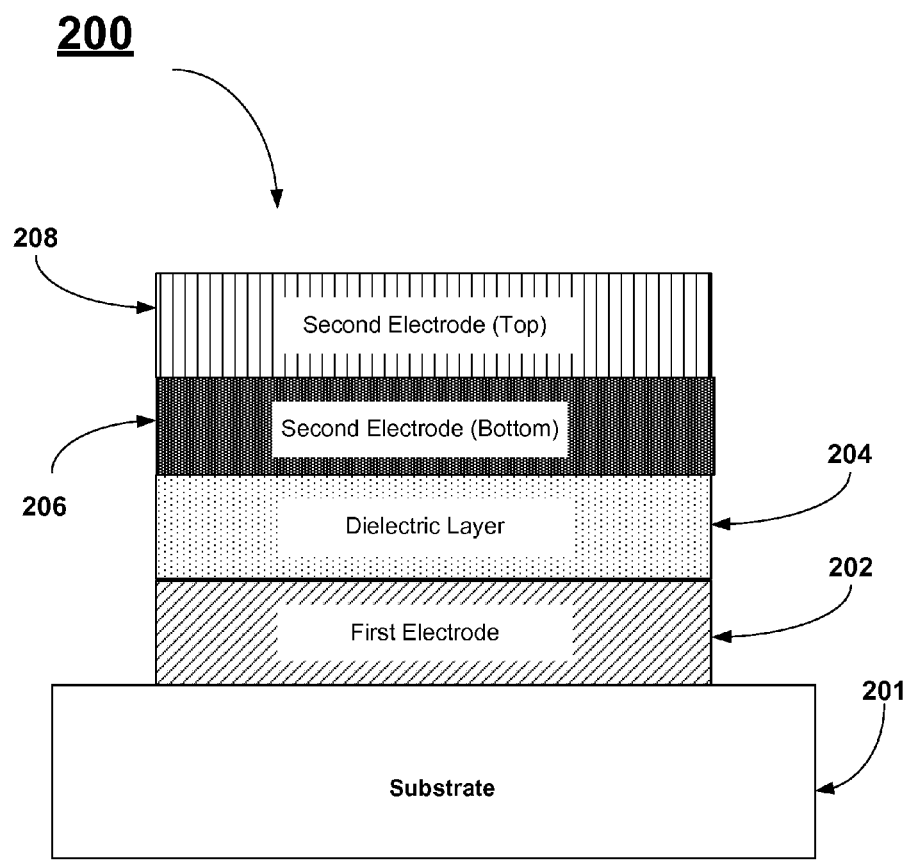
FIG. 2 illustrates a simplified cross-sectional view of a DRAM capacitor stack fabricated in accordance with some embodiments of the present invention.
Figure 3:
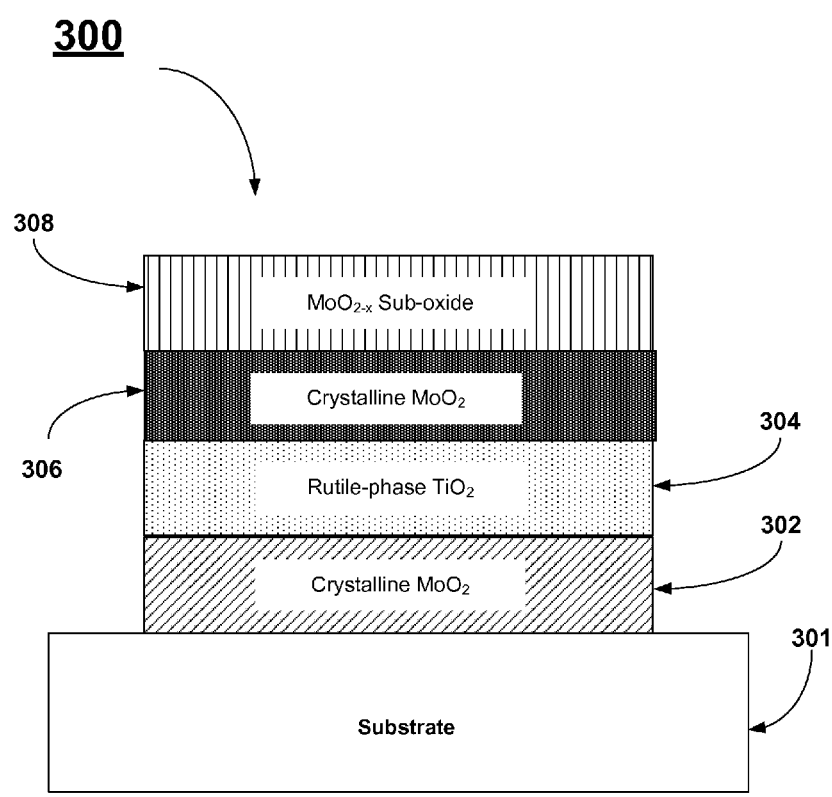
FIG. 3 illustrates a simplified cross-sectional view of a DRAM capacitor stack fabricated in accordance with some embodiments of the present invention.

In FIGS. 2, and 3 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

FIG. 2 illustrates a simple capacitor stack, 200, consistent with some embodiments of the present invention. Using the method as outlined in FIG. 1 and described above, first electrode layer, 202, is formed on substrate, 201. Generally, the substrate has already received several processing steps in the manufacture of a full DRAM device. First electrode layer, 202, comprises one of metals, conductive metal oxides, conductive metal nitrides, conductive metal silicides, etc. Optionally, first electrode, 202, can be annealed to crystallize the material.

In the next step, dielectric layer, 204, would then be formed on the annealed first electrode layer, 202. A wide variety of dielectric materials have been targeted for use in DRAM capacitors. Examples of suitable dielectric materials comprise $SiO_2$, a bilayer of $SiO_2$ and $Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT), or doped versions of the same. These dielectric materials may be formed as a single layer or may be formed as a hybrid or nanolaminate structure. Typically, dielectric layer, 204, is subjected to a PDA treatment before the formation of the second electrode as mentioned earlier.

In the next step, the bottom layer of the bilayer second electrode structure, 206, is formed on dielectric layer, 204. The bottom layer of the bilayer second electrode structure may be a conductive binary metal compound material as described above, a metal, or a combination thereof. In this example, the bottom layer of the bilayer second electrode structure is a conductive metal oxide.

In the next step, the top layer of the bilayer second electrode structure, 208, is formed on the bottom layer of the bilayer second electrode structure, 206. The top layer of the bilayer second electrode structure may be a conductive binary metal compound material as described above, a metal, or a combination thereof. In this example, the top layer of the bilayer second electrode structure is a conductive metal oxide. The conductive metal oxide forming the top layer of the bilayer second electrode structure may be the same as the bottom layer of the bilayer second electrode structure or may be a different conductive metal oxide material. The conductive metal oxide forming the top layer of the bilayer second electrode structure is formed so that it is oxygen deficient (i.e. a sub-oxide). If the capacitor stack is later annealed or exposed to a high temperature treatment in the presence of an oxidizer, the top layer sub-oxide of the bilayer second electrode structure will react with the oxidizer to become more stoichiometric. As the top layer reacts with the oxidizer, this prevents the oxidizer from diffusing to the bottom layer and reacting with the bottom layer. This behavior serves to protect the bottom layer of the bilayer second electrode structure from becoming oxidized and degrading its performance. Typically, the capacitor stack, 200, would then be subjected to a PMA treatment. The PMA treatment serves to crystallize the second electrode layer and remove interface states that may have formed at the dielectric/electrode interface during the formation process. Advantageously, the PMA treatment is performed in an atmosphere that contains an amount of an oxidizing species. The oxidizing species serves to repair oxygen vacancies that may have formed in the dielectric layer. The presence of oxygen vacancies tends to increase the leakage current in the capacitor.

FIG. 3 illustrates a simple capacitor stack, 300, consistent with some embodiments of the present invention. Using the method as outlined in FIG. 1 and described above, first electrode layer, 302, is formed on substrate, 301. Generally, the substrate has already received several processing steps in the manufacture of a full DRAM device. First electrode layer, 302, comprises one of metals, conductive metal oxides, conductive metal nitrides, conductive metal silicides, etc. For this example, first electrode layer, 302, comprises a conductive metal oxide that may serve to promote the rutile phase of $TiO_2$. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. A specific electrode material of interest is the crystalline $MoO_2$ compound of molybdenum dioxide.

Optionally, first electrode, 302, can be annealed to crystallize the material. In the case of crystalline $MoO_2$, it is advantageous to anneal the first electrode in a reducing atmosphere to prevent the formation of oxygen-rich compounds as discussed earlier.

In one example of the present invention, a first electrode comprising between about 5 nm and about 10 nm of molybdenum oxide is formed on a substrate. The molybdenum oxide electrode material is formed at a process temperature between about 125 C. and 400 C. using an ALD process technology. Optionally, the substrate with the first electrode is then annealed in a reducing atmosphere comprising between about 1% and about 10% $H_2$ in $N_2$ and advantageously between about 5% and about 10% $H_2$ in $N_2$ between 400 and 520 C. for between about 1 millisecond and about 60 minutes.

In the next step, dielectric layer, 304, would then be formed on the annealed first electrode layer, 302. A wide variety of dielectric materials have been targeted for use in DRAM capacitors. Examples of suitable dielectric materials comprise $SiO_2$, a bilayer of $SiO_2$ and $Si_xN_y$, $SiON$, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT), or doped versions of the same. These dielectric materials may be formed as a single layer or may be formed as a hybrid or nanolaminate structure. Typically, dielectric layer, 304, is subjected to a PDA treatment before the formation of the second electrode as discussed previously. A specific dielectric material of interest is $TiO_2$ doped with $Al_2O_3$ to between about 5 atomic % and about 15 atomic % Al.

In a specific example, the dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with Al at a concentration between about 5 atomic % and about 15 atomic % Al. The $TiO_2$ dielectric layer is formed at a process temperature between about 200 C. and 350 C. using an ALD process technology. The substrate with the first electrode and dielectric layer is then annealed in an oxidizing atmosphere comprising between about 0% $O_2$ to about 100% $O_2$ in $N_2$ and advantageously between about 0% $O_2$ to about 20% $O_2$ in $N_2$ at temperatures between about 400 C. to about 600 C. for between about 1 millisecond to about 60 minutes.

In the next step, the bottom layer of the bilayer second electrode structure, 306, is formed on dielectric layer, 304. The bottom layer of the bilayer second electrode structure may be a conductive binary metal compound material as described above, a metal, or a combination thereof. In this example, the bottom layer of the bilayer second electrode structure is a conductive metal oxide, and more specifically, crystalline $MoO_2$.

In one example of the present invention, the bottom layer of the bilayer second electrode structure comprising between about 0.1 nm and about 100 nm of molybdenum oxide is formed on a substrate. The crystalline $MoO_2$ electrode material is formed at a process temperature between about 125 C. and 400 C. using an ALD process technology. This layer is not annealed before the top layer of the bilayer second electrode structure is formed.

In the next step, the top layer of the bilayer second electrode structure, 308, is formed on the bottom layer of the bilayer second electrode structure, 306. The top layer of the bilayer second electrode structure may be a conductive binary metal compound material as described above, a metal, or a combination thereof. In this example, the top layer of the bilayer second electrode structure is a conductive metal oxide, and more specifically, $MoO_{2-x}$ where x is between 0 and 2. This results in the top layer of the bilayer second electrode structure being a sub-oxide of $MoO_2$. The $MoO_2$, top layer will protect the underlying $MoO_2$ layer from becoming oxidized to unwanted oxygen-rich $MoO_{2+y}$ compounds (where y is between 0.1 and 1) during subsequent processing steps. For example, the $MoO_3$ compound is an insulator and is undesirable as a component in an electrode layer.

Alternatively, the top layer of the bilayer second electrode structure is a conductive metal oxide that is different from the bottom layer of the bilayer second electrode structure. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. Some of these metal oxide compounds exhibit resistance to further oxidation in the presence of an oxidizer and elevated temperatures. This allows the bottom layer of the bilayer second electrode structure to be chosen for properties such as crystal structure similarity to the dielectric layer, high work function, chemical stability, structural stability, electrical stability, etc. It also allows the top layer of the bilayer second electrode structure to be chosen for properties such as oxygen resistance, conductivity, etc.

Alternatively, the top layer of the bilayer second electrode structure could be a conductive material such a conductive metal nitride, a conductive metal silicide, or a noble metal. However, one requirement is that the top layer of the bilayer second electrode structure be resistant to oxidation, so some of these candidates will be naturally excluded.

In some embodiments of the present invention, the top layer of the bilayer second electrode structure is $MoO_{2-x}$, where x is between 0 and 2, and the layer is formed using an ALD technology. To control the composition of the layer, the reactive gas pulse of the ALD cycle is an oxidizer. The oxidizer may be any one of $O_2$, $O_3$, $H_2O$, NO, $N_2O$, $H_2O_2$, an alcohol, an alkoxide, or combinations thereof. Typically, the oxidizer is $O_3$. The oxidizer concentration and pulse time would be selected so that the adsorbed Mo precursor is not fully oxidized. This ensures that the final material composition will be a sub-oxide of $MoO_2$. Alternatively, pure layers of Mo (i.e. no oxidation pulses) can be interspersed within a number of $MoO_2$ layers to ensure that the final material composition will be a sub-oxide of $MoO_2$ after annealing.

In some embodiments of the present invention, the top layer of the bilayer second electrode structure is $MoO_{2-x}$, where x is between 0 and 2, and the layer is formed using a PVD technology. To control the composition of the layer, the reactive gas introduced during the PVD process is an oxidizer. The oxidizer may be any one of $O_2$, $O_3$, $H_2O$, NO, $N_2O$, $H_2O_2$, an alcohol, an alkoxide, or combinations thereof. Typically, the oxidizer is $O_2$. The oxidizer concentration would be selected so that the deposited Mo layer is not fully oxidized. This ensures that the final material composition will be a sub-oxide of $MoO_2$. Alternatively, pure layers of Mo (i.e. no oxidation gas) can be interspersed within a number of $MoO_2$ layers to ensure that the final material composition will be a sub-oxide of $MoO_2$ after annealing.

The capacitor stack, 300, is then annealed in an oxidizing atmosphere comprising between about 0% $O_2$ to about 10% $O_2$ in $N_2$ at between about 400 C. to about 550 C. for between about 1 millisecond to about 60 minutes. The PMA treatment generally has a lower oxygen concentration to prevent oxidation of the two electrode layers. The sub-oxide nature of the top layer of the bilayer second electrode structure serves to protect the underlying crystalline $MoO_2$ bottom layer of the bilayer second electrode structure ensuring that the bilayer second electrode structure maintains high conductivity and a high work function.

Figure 4:
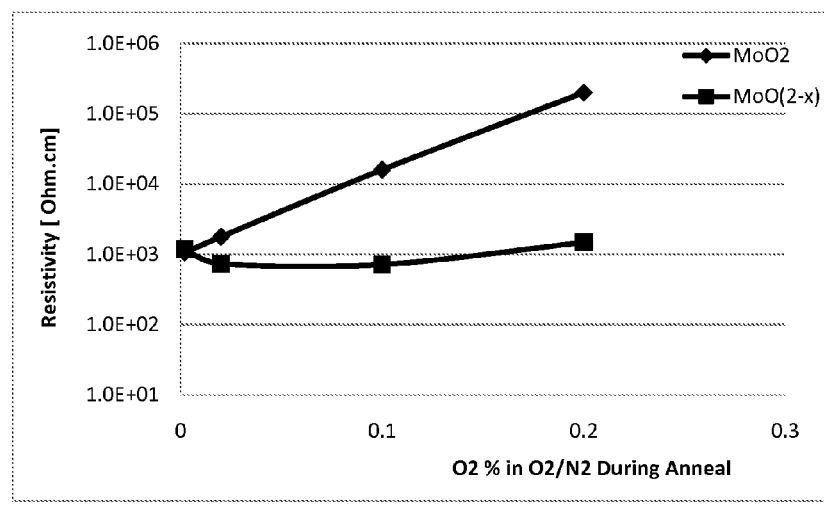
FIG. 4 presents data for the measured resistivity versus $O_2$ flow rate during a PMA treatment for $MoO_2$ and $MoO_{2-x}$.

FIG. 4 presents data for the measured resistivity versus $O_2$ flow rate during a PMA treatment for $MoO_2$ and $MoO_{2-x}$ samples. The samples were subjected to PMA treatments at 460 C. for 10 minutes with varying $O_2$ flow rates during the anneal. The $MoO_2$ samples exhibit a dramatic increase in resistivity as they become oxidized to oxygen rich compounds of molybdenum oxide (i.e. $Mo_4O_{11}$ and $MoO_3$, etc.). Conversely, the $MoO_{2-x}$ samples are sub-oxides of $MoO_2$. As they are annealed, they also become oxidized, but exhibit stable resistivity since they are becoming more like $MoO_2$.

Figure 5:
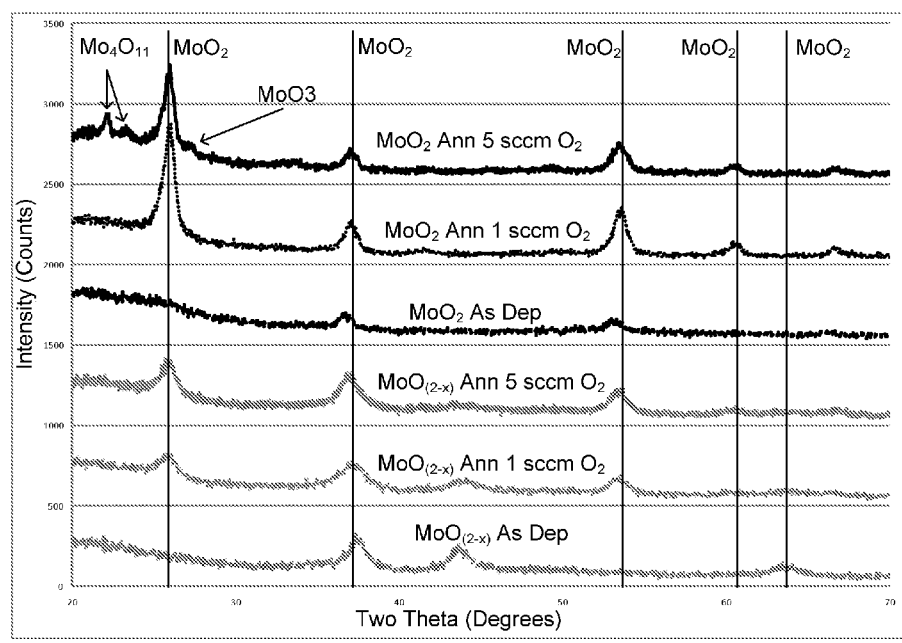
FIG. 5 present XRD data for as deposited as well as after different anneal conditions for $MoO_2$ and $MoO_{2-x}$.

FIG. 5 present XRD data for as deposited as well as after different anneal conditions for $MoO_2$ and $MoO_{2-x}$. The samples were subjected to anneal treatments at 460 C. for 10 minutes with either 1 sccm $O_2$ or 5 sccm $O_2$. In the XRD data for the $MoO_2$ samples, Bragg reflections associated with $MoO_3$ and $Mo_4O_{11}$ phases (i.e. oxygen rich relative to $MoO_2$) are present after the anneal. In the XRD data for the $MoO_{2-x}$ samples, only Bragg reflections associated with $MoO_2$ phases are present after the anneal.

In another example, the first electrode and dielectric layers are formed as previously discussed. In the next step, the bottom layer of the bilayer second electrode structure is formed on the dielectric layer. The bottom layer of the bilayer second electrode structure may be a conductive binary metal compound material as described above, a metal, or a combination thereof. In this example, the bottom layer of the bilayer second electrode structure is a conductive metal oxide, and more specifically, $RuO_2$.

In the next step, the top layer of the bilayer second electrode structure is formed on the bottom layer of the bilayer second electrode structure. The top layer of the bilayer second electrode structure may be a conductive binary metal compound material as described above, a metal, or a combination thereof. In this example, the top layer of the bilayer second electrode structure is a metal, and more specifically, Ru. Ru metal shows excellent oxidation resistance during subsequent PMA treatments or other subsequent DRAM fabrication steps.

In another example, the first electrode and dielectric layers are formed as previously discussed. In the next step, the bottom layer of the bilayer second electrode structure is formed on the dielectric layer. The bottom layer of the bilayer second electrode structure may be a conductive binary metal compound material as described above, a metal, or a combination thereof. In this example, the bottom layer of the bilayer second electrode structure is a conductive metal oxide, and more specifically, $RuO_2$.

In the next step, the top layer of the bilayer second electrode structure is formed on the bottom layer of the bilayer second electrode structure. The top layer of the bilayer second electrode structure may be a conductive binary metal compound material as described above, a metal, or a combination thereof. In this example, the top layer of the bilayer second electrode structure is a conductive metal oxide, and more specifically, $RuO_{2-x}$ (i.e. a sub-oxide of $RuO_2$). $RuO_{2-x}$ is expected to show excellent oxidation resistance during subsequent PMA treatments or other subsequent DRAM fabrication steps.

In another example, the first electrode and dielectric layers are formed as previously discussed. In the next step, the bottom layer of the bilayer second electrode structure is formed on the dielectric layer. The bottom layer of the bilayer second electrode structure may be a conductive binary metal compound material as described above, a metal, or a combination thereof. In this example, the bottom layer of the bilayer second electrode structure is a conductive metal oxide, and more specifically, $WO_2$.

In the next step, the top layer of the bilayer second electrode structure is formed on the bottom layer of the bilayer second electrode structure. The top layer of the bilayer second electrode structure may be a conductive binary metal compound material as described above, a metal, or a combination thereof. In this example, the top layer of the bilayer second electrode structure is a conductive metal oxide, and more specifically, $WO_{2-x}$ (i.e. a sub-oxide of $WO_2$). $WO_{2-x}$ is expected to show excellent oxidation resistance during subsequent PMA treatments or other subsequent DRAM fabrication steps.

Figure 6:
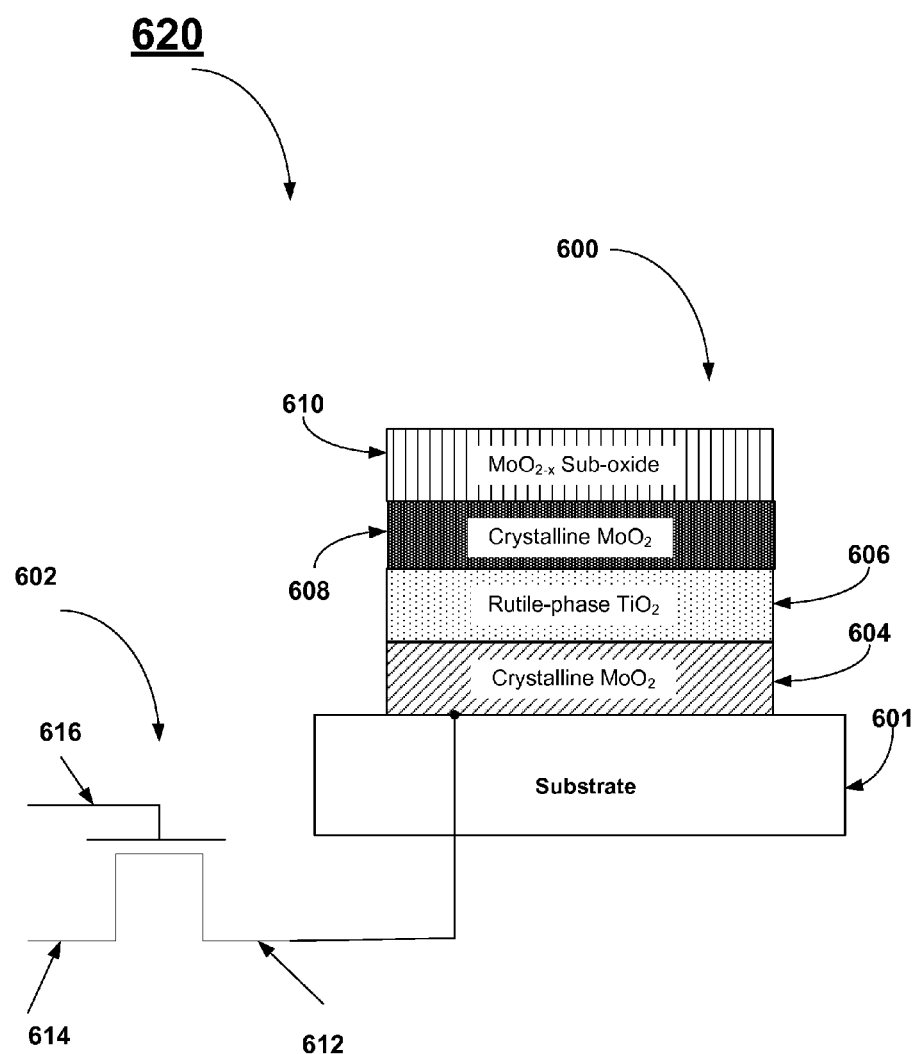
FIG. 6 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 6 is used to illustrate one DRAM cell, 620, manufactured using a bilayer second electrode structure as discussed previously. The cell, 620, is illustrated schematically to include two principle components, a cell capacitor, 600, and a cell transistor, 602. The cell transistor is usually constituted by a MOS transistor having a gate, 616, source, 612, and drain, 614. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously in connection with FIG. 3, the cell capacitor, 600, comprises a first electrode, 604, formed on substrate, 601. The first electrode, 604, is connected to the source or drain of the cell transistor, 602. For illustrative purposes, the first electrode has been connected to the source, 612, in this example. For the purposes of illustration, first electrode, 604, will be crystalline $MoO_2$ in this example. As discussed previously, first electrode, 604, may be subjected to an anneal in a reducing atmosphere before the formation of the dielectric layer to crystallize the $MoO_2$ and to reduce any $MoO_{2+x}$ compounds that may have formed during the formation of the first electrode. Dielectric layer, 606, is formed on top of the first electrode. For the purposes of illustration, dielectric layer, 606, will be rutile-phase $TiO_2$. As discussed previously, the $TiO_2$ may be doped. Typically, the dielectric layer is then subjected to a PDA treatment. The bottom layer of the bilayer second electrode structure, 608, is then formed on top of the dielectric layer. For the purposes of illustration, the bottom layer of the bilayer second electrode structure, 608, will be crystalline $MoO_2$ in this example. The top layer of the bilayer second electrode structure, 610, is then formed on top of the bottom layer of the bilayer second electrode structure. For the purposes of illustration, the top layer of the bilayer second electrode structure, 610, will be a sub-oxide ($MoO_{2-x}$) of crystalline $MoO_2$ in this example. This completes the formation of the capacitor stack. Typically, the capacitor stack is then subjected to a PMA treatment.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
    forming a first electrode layer on a substrate;
    forming a dielectric layer on the first electrode layer; and
    forming a second electrode layer on the dielectric layer,
        wherein forming the second electrode layer comprises forming a bottom layer on the dielectric layer and forming a top layer on the bottom layer,
        wherein the bottom layer comprises $MoO_2$ and wherein the top layer comprises a sub-oxide of $MoO_2$.

2. The method of claim 1, wherein the first electrode layer comprises a conductive oxide.

3. The method of claim 1, further comprising, prior to forming the dielectric layer, annealing the capacitor stack comprising first electrode layer to crystalize a material of the first electrode layer.

4. The method of claim 1, wherein the dielectric layer comprises at least one of $SiO_2$, a bilayer of $SiO_2$ and $Si_xN_y$, SiON, $Al_2O_3$, $HfO_2$, $HfSiO_X$, $ZrO_2$, $Ta_2O_5$, $TiO_2$, $SrTiO_3$ (STO), $SrBaTiO_X$ (SBT), $PbZrTiO_X$ (PZT), or doped versions of the same.

5. The method of claim 1, wherein the dielectric layer is a nanolaminate.

6. The method of claim 1, further comprising, prior to forming the second electrode layer, annealing the stack comprising the dielectric layer.

7. The method of claim 1, further comprising, prior to forming the second electrode layer, annealing the stack comprising the second electrode layer, wherein during annealing the top layer is oxidized.

8. The method of claim 7, wherein annealing is performed in an oxygen containing environment.

9. The method of claim 1, wherein a material of the first electrode layer promotes formation of a rutile phase of a material of the dielectric layer when forming the dielectric layer on the first electrode layer.

10. The method of claim 9, wherein the material of the first electrode layer comprises one of molybdenum oxide, tungsten oxide, ruthenium oxide, iron oxide, iridium oxide, chromium oxide, manganese oxide, tin oxide, cobalt oxide, or nickel oxide.

11. The method of claim 9, wherein the material of the first electrode layer comprises $MoO_2$.

12. The method of claim 11, wherein the material of the dielectric layer comprises $TiO_2$.

13. The method of claim 12, wherein the material of the dielectric layer further comprises a dopant.

14. The method of claim 13, wherein the dopant comprises $Al_2O_3$.

15. The method of claim 14, wherein the dopant has a concentration of between about 5 atomic % and 15 atomic %.

16. The method of claim 10, wherein at least 30% of $TiO_2$ is present in the rutile phase.

17. The method of claim 1, wherein forming the top layer on the bottom layer comprises atomic layer deposition with a partial oxidation of a molybdenum precursor.

18. The method of claim 1, wherein forming the top layer on the bottom layer comprises forming a nanolaminate structure comprising one or more molybdenum layers and one or more molybdenum oxide layers.

19. The method of claim 18, further comprising annealing the nanolaminate structure.

* * * * *